(12) United States Patent
Joshi et al.

(10) Patent No.: US 11,031,317 B2
(45) Date of Patent: Jun. 8, 2021

(54) DIRECT BONDED METAL SUBSTRATES WITH ENCAPSULATED PHASE CHANGE MATERIALS AND ELECTRONIC ASSEMBLIES INCORPORATING THE SAME

(71) Applicant: Toyota Motor Engineering & Manufacturing North America, Inc., Plano, TX (US)

(72) Inventors: Shailesh N. Joshi, Ann Arbor, MI (US); Yanghe Liu, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 0 days.

(21) Appl. No.: 16/597,133

(22) Filed: Oct. 9, 2019

(65) Prior Publication Data

US 2021/0111098 A1  Apr. 15, 2021

(51) Int. Cl.
| | |
|---|---|
| *H01L 23/427* | (2006.01) |
| *H01L 21/48* | (2006.01) |
| *H01L 23/373* | (2006.01) |
| *H01L 23/367* | (2006.01) |
| *H05K 7/20* | (2006.01) |
| *H01L 23/42* | (2006.01) |
| *H01L 23/40* | (2006.01) |

(52) U.S. Cl.
CPC ........ *H01L 23/427* (2013.01); *H01L 21/4871* (2013.01); *H01L 23/3675* (2013.01); *H01L 23/3735* (2013.01); *H01L 23/42* (2013.01); *H05K 7/20445* (2013.01); *H01L 2023/4068* (2013.01)

(58) Field of Classification Search
CPC ............... H01L 23/427; H01L 21/4871; H01L 23/3735; H01L 23/42; H01L 23/3675; H01L 2023/4068; H05K 7/20445
See application file for complete search history.

(56) References Cited

U.S. PATENT DOCUMENTS

| | | | |
|---|---|---|---|
| 6,202,739 B1 * | 3/2001 | Pal ...................... | H01L 23/4275 165/10 |
| 6,317,321 B1 | 11/2001 | Fitch et al. | |
| 6,644,395 B1 | 11/2003 | Bergin | |
| 8,654,311 B2 | 2/2014 | Sewell et al. | |

(Continued)

FOREIGN PATENT DOCUMENTS

| | | |
|---|---|---|
| CN | 101430929 B | 12/2013 |
| CN | 104272453 B | 5/2016 |

(Continued)

*Primary Examiner* — Feifei Yeung Lopez
(74) *Attorney, Agent, or Firm* — Dinsmore & Shohl LLP

(57) ABSTRACT

Direct-bonded metal substrates of electronic assemblies are disclosed. For example, the direct-bonded metal substrate includes a ceramic substrate and a first conductive layer. The first conductive layer is bonded to a first surface of the ceramic substrate, and the first conductive layer includes a first core and a first encapsulating layer that encapsulates the first core. The first core includes a phase change material having a first melting temperature, the first encapsulating layer includes an encapsulating material having a second melting temperature, and the second temperature is greater than the first melting temperature.

18 Claims, 9 Drawing Sheets

(56) References Cited

U.S. PATENT DOCUMENTS

| | | | | |
|---|---|---|---|---|
| 2006/0118925 A1* | 6/2006 | Macris | ............ | H01L 23/433 |
| | | | | 257/667 |
| 2006/0131738 A1* | 6/2006 | Furman | ............ | H01L 23/42 |
| | | | | 257/720 |
| 2012/0061852 A1* | 3/2012 | Su | ............ | H01L 23/3128 |
| | | | | 257/777 |
| 2013/0224510 A1* | 8/2013 | Deng | ............ | H01L 23/4275 |
| | | | | 428/576 |
| 2013/0328204 A1* | 12/2013 | Zommer | ............ | H01L 24/03 |
| | | | | 257/765 |
| 2016/0334844 A1 | 11/2016 | Nguyen et al. | | |

FOREIGN PATENT DOCUMENTS

| | | |
|---|---|---|
| CN | 205375543 U | 7/2016 |
| CN | 103762296 B | 3/2017 |
| CN | 106654005 A | 5/2017 |
| KR | 100757614 B1 | 9/2007 |

\* cited by examiner

DIRECT BONDED METAL SUBSTRATES WITH ENCAPSULATED PHASE CHANGE MATERIALS AND ELECTRONIC ASSEMBLIES INCORPORATING THE SAME

FIELD

The present specification generally relates to electronic assemblies, and more particularly, to electronic assemblies that include a direct bonded metal substrate with an encapsulated phase change material.

BACKGROUND

Electronic assemblies are often utilized in high-power electrical applications, such as inverter systems for hybrid electric vehicles and electric vehicles. Such electronic assemblies may include power semiconductor devices, such as insulated-gate bipolar transistors (IGBTs) and power transistors that are thermally bonded to a metal substrate. The metal substrate may also be thermally bonded to a cooling structure, such as a heat sink.

Electronic assemblies may include a direct bonded metal (DBM) substrate (e.g., a direct bonded copper (DBC) substrate) that has a pair of metal layers, wherein each metal layer of the pair of metal layers is directly bonded to each side of a ceramic substrate, such as alumina. A semiconductor device may then be coupled to one of the metal layers. However, heat flux generated by the semiconductor device during temperature cycling, for example, may cause mechanical stress due to the metal layers, the ceramic substrate, and other additional components of the electronic assembly having different coefficients of thermal expansion. The different coefficients of thermal expansion cause the various components of the electronic assembly to expand and contract at different magnitudes during both temperature and power cycling, thereby inducing mechanical stress on the electronic assembly. Accordingly, the thermally induced mechanical stress may cause the electronic assembly to mechanically fail.

Furthermore, with advances in battery technology and increases in electronic assembly packaging density, operating temperatures of electronic assemblies have increased and are currently approaching 200-250° C. The heat generated through operation of the electronic assembly is thermally conducted away from the electronic devices to prevent damage to the electronic assembly. However, at operating temperatures approaching 200-250° C., the rate at which heat may be thermally conducted away from the electronic assembly may be limited, thereby resulting in even greater temperature increases and potential for thermally induced mechanical stress to electronic assemblies.

Accordingly, there is a need for structures and methods that minimize thermally induced mechanical stress generated by electronic assemblies.

SUMMARY

In one embodiment, a direct-bonded metal substrate includes a ceramic substrate and a first conductive layer. The first conductive layer is bonded to a first surface of the ceramic substrate, and the first conductive layer includes a first core and a first encapsulating layer that encapsulates the first core. The first core includes a phase change material having a first melting temperature, the first encapsulating layer includes an encapsulating material having a second melting temperature, and the second temperature is greater than the first melting temperature.

In another embodiment, an electronic assembly includes an electronic device having an operating temperature and a direct-bonded metal substrate bonded to the electronic device. The direct-bonded metal substrate includes a ceramic substrate and a first conductive layer. The electronic device is bonded to the first conductive layer. The first conductive layer is disposed on a first surface of the ceramic substrate, and the first conductive layer includes a first core and a first encapsulating layer that encapsulates the first core. The first core includes a phase change material having a first melting temperature, the first encapsulating layer includes an encapsulating material having a second melting temperature, and the second temperature is greater than the first melting temperature. The operating temperature is greater than the first melting temperature and is less than the second melting temperature. The electronic device is bonded to the first encapsulating layer.

In yet another embodiment, a method of forming a direct-bonded metal substrate includes depositing a first core onto a first surface of a ceramic substrate, wherein the first core includes a phase change material having a first melting temperature. The method also includes bonding the first core to the first surface of the ceramic substrate and encapsulating the first core against the first surface of the substrate with a first encapsulating layer. The first encapsulating layer includes an encapsulating material having a second melting temperature, and the second melting temperature is greater than the first melting temperature.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
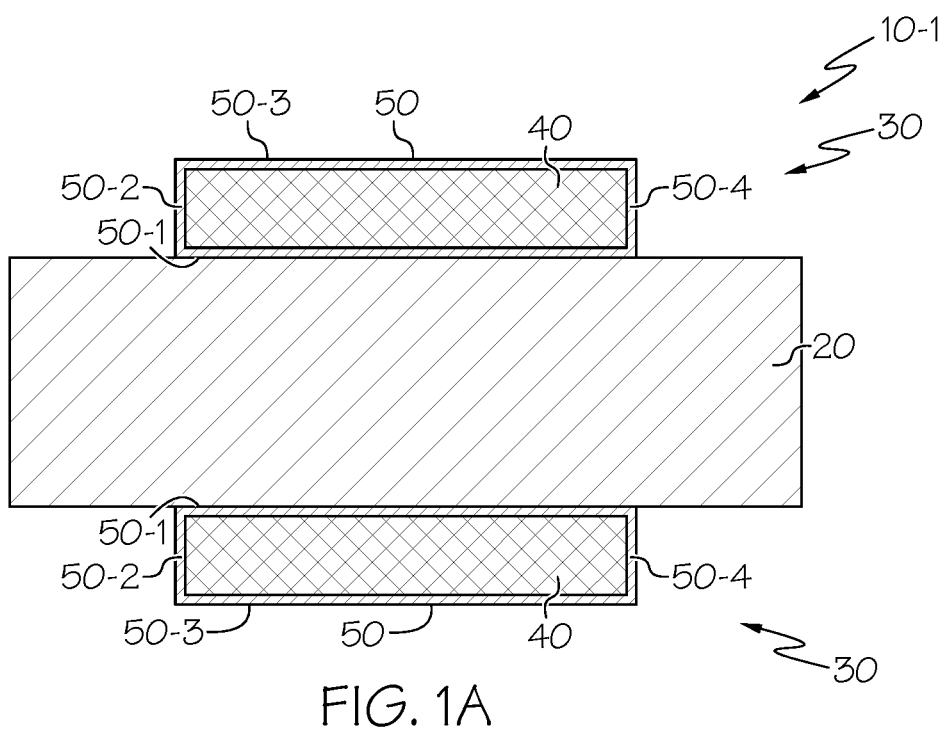
FIG. 1A schematically depicts a cross-sectional view of a conductive layer and a bonding layer of an example direct bonded metal substrate according to one or more embodiments shown and described herein.

Referring generally to the figures, embodiments of the present disclosure are generally related to direct bonded metal (DBM) substrates with a conductive layer having an encapsulated core. The core, which includes a phase change material and is encapsulated by an encapsulating layer, may have a phase change temperature that is less than a phase change temperature of the encapsulating layer.

The DBM substrates may be included within an electronic assembly, which may be implemented in various electrical systems including, but not limited to, rectifier systems, inverter systems, DC-to-DC converter systems, and AC-to-AC converter systems. During operation, the electronic assembly may be subjected to temperatures of up to 200-250° C., which may induce mechanical stress in the DBM substrate and other components of the electronic assembly. While heat may be removed from the electronic assembly during operation to reduce the temperature and mitigate thermally induced damage to the electronic assembly, the heat removal rate may be limited by the rate of heat conduction through the DBM substrate or other components of the electronic assembly.

Furthermore, electrical transients of the electronic assembly and fabrication of the electronic assembly may subject the electronic assembly to temperature cycling. Temperature cycling may induce mechanical stress in the DBM substrate and the electronic assembly due to different coefficients of thermal expansion of the electronic assembly, the DBM substrate, and other additional components of the electronic assembly.

In order to mitigate the thermally induced mechanical stress caused by temperature cycling and the high operating temperature of the electronic assembly, the phase change material of the DBM substrate may change phases (e.g., from a solid phase to a liquid phase) during periods of high operating temperatures. During the phase change, the phase change material may absorb heat generated by the electronic assembly at high operating temperatures, thereby increasing the heat capacity of the DBM substrate and enabling the DBM substrate to remove a greater amount of heat from the electronic assembly during operating periods of high heat output. Simultaneously, the magnitude of temperature cycling (i.e., the temperature difference between two extremes of a temperature cycling curve) of the electronic assembly decreases, thereby minimizing the thermally induced mechanical stress to the electronic assembly when operating at the threshold temperature and during temperature cycling.

Furthermore, the encapsulating layer of the DBM substrate may have a Young's modulus (e.g., a stiffness) that causes the conductive layers to flex when the electronic assembly operates at the high operating temperature, and the encapsulating layer may have a melting temperature that is greater than the operating temperature of the electronic assembly and the melting temperature of the phase change material. Accordingly, the encapsulating layers of the DBM substrate may, without melting, flex when the electronic assembly operates at the operating temperature, thereby minimizing the thermally induced mechanical stress to the DBM substrate when the electronic assembly is operating at the operating temperature.

Referring now to FIG. 1A, a cross-section view of a DBM substrate 10-1 is schematically depicted. In the illustrated embodiment, the DBM substrate 10-1 includes a ceramic substrate 20, and conductive layers 30. Each of the conductive layers 30 includes a core 40 and an encapsulating layer 50.

In some embodiments, the ceramic substrate 20 may include any material that electrically insulates the conductive layers 30 from each other. As a non-limiting example, the ceramic substrate 20 may include alumina ($Al_2O_3$), aluminum nitride (AlN), beryllium oxide (BeO), silicon nitride (SiN), silicon carbide (SiC), or other ceramic materials. As a non-limiting example, the thickness of the ceramic substrate 20 may be in a range of 0.2 millimeters to 2 millimeters, including endpoints. It should be understood that other thicknesses of the ceramic substrate 20 may be provided.

In some embodiments, the core 40 may include a phase change material (PCM), such as a metal or metal alloy. As a non-limiting example, the electrically conductive metal may be, but is not limited to, tin (Sn), indium (In), bismuth (Bi), other metals having melting temperatures from 50° C. to 250° C., tin alloys, and/or indium alloys. In some embodiments, the electrically conductive metal of the core 40 may have a thermal conductivity of greater than or equal to 50 watts per meter per degree Kelvin (W/(m*K)), such as from 50 W/(m*K) to 100 W/(m*K). As non-limiting examples, the electrically conductive metal of the core 40 may have a thermal conductivity of 67 W/(m*K) or 82 W/(m*K). In some embodiments, the coefficient of linear thermal expansion of the electrically conductive metal of the core 40 may be between 0.0000130 per degree Kelvin (m/K) and 0.0000330 m/K, including endpoints.

In another example embodiment, the PCM may be a paraffin wax. As a non-limiting example, the paraffin wax may include one or a plurality of saturated hydrocarbons having at least 20 carbon atoms, such as from 20 to 40 carbon atoms and a melting temperature in a range of 50° C. to 250° C. In some embodiments, the paraffin wax may have a thermal conductivity of greater than or equal to 0.1 W/(m*K), such as 0.189 W/(m*K). In some embodiments, the coefficient of linear thermal expansion of the paraffin wax may be between 0.000106 m/K and 0.000480 m/K.

In some embodiments, the PCM of the core 40 may be configured to change phase at a phase change temperature that is less than or equal to an operating temperature of an electronic assembly (shown below). In some embodiments, the phase change of the PCM of the core 40 may be a change in phase between liquid and solid phases or a change in phase between two solid phases, such as between an amorphous solid phase and a crystalline or partially crystalline solid phase. As a non-limiting example, the PCM of the core 40 may have a melting temperature in a range of 50° C. to 250° C., 100° C. to 250° C., or 150° C. to 250° C., including endpoints.

In the illustrated embodiment, the core 40 may be entirely encapsulated by the encapsulating layer 50. The encapsulating layer 50 may include a material that has a melting temperature greater than the melting temperature of the PCM of the core 40. As a non-limiting example, the encapsulating material may have a melting temperature that is greater than 250° C., such as greater than 300° C., greater than 350° C., greater than 400° C., or greater than 500° C. Furthermore, the encapsulating layer 50 may include an electrically conductive metal or metal oxide configured to remain in a solid phase at temperatures greater than the melting temperature of the PCM of the core 40 and temperatures greater than the operating temperature range of an electronic assembly (shown below). Non-limiting examples of the encapsulating layer 50 include platinum, copper, silica, magnesium oxide, zirconia, and/or other metal oxides. In some embodiments, the electrically conductive metal or metal oxide of the encapsulating layer 50 may have a thermal conductivity of greater than or equal to 50 W/(m*K), such as from 50 W/(m*K) to 100 W/(m*K). As a non-limiting example, the electrically conductive metal of the encapsulating layer 50 may have a thermal conductivity of 71 W/(m*K). In some embodiments, the coefficient of linear thermal expansion of the electrically conductive metal of the encapsulating layer 50 may be between 0.000001 m/K and 0.0000020 m/K, including endpoints (e.g., 0.000009 m/K).

In the illustrated embodiment, the encapsulating layer 50 may have a Young's modulus that enables the encapsulating layer 50 to flex when the encapsulated PCM of the core 40 changes phase. As a non-limiting example, when the electronic device (shown below) operates at a temperature greater than the melting temperature of the PCM of the core 40, the PCM changes from a solid phase to a liquid phase. Moreover, when the electronic device (shown below) operates at a temperature greater than the melting temperature of the PCM of the core 40, the encapsulating layer 50 may flex and does not melt, thereby minimizing the thermally induced mechanical stress to the DBM substrate 10-1 and the electronic device when the electronic device (shown below in FIGS. 3A-3B) is operating at high temperatures.

The core 40 and the encapsulating layer 50 may have varying thicknesses. As a non-limiting example, the encapsulating layer 50 may have a thickness in the range of 100 nanometers to 0.1 millimeters, including endpoints. As another non-limiting example, the core 40 may have a thickness in the range of 0.1 millimeters to 1.0 millimeter, including endpoints. It should be understood that other thicknesses of the core 40 and the encapsulating layer 50 may be provided.

In various embodiments, the conductive layers 30 are formed by initially depositing a first portion of the encapsulating layer 50-1 onto the ceramic substrate 20. Subsequently, the core 40 may be deposited onto the first portion of the encapsulating layer 50-1, and the core 40 may then be encapsulated by the remaining portions of the encapsulating layer 50-2, 50-3, 50-4. As a non-limiting example, an atomic vapor deposition process may be utilized to deposit the first portion of the encapsulating layer 50-1, the core 40, and the remaining portions of the encapsulating layer 50-2, 50-3, 50-4, as described below in further detail with reference to FIG. 2A.

While FIG. 1A illustrates the core 40 entirely encapsulated by the encapsulating layer 50, in other embodiments, the core 40 may be encapsulated by the encapsulating layer 50 and other materials of the DBM substrate, as described below in further detail.

Figure 1B:
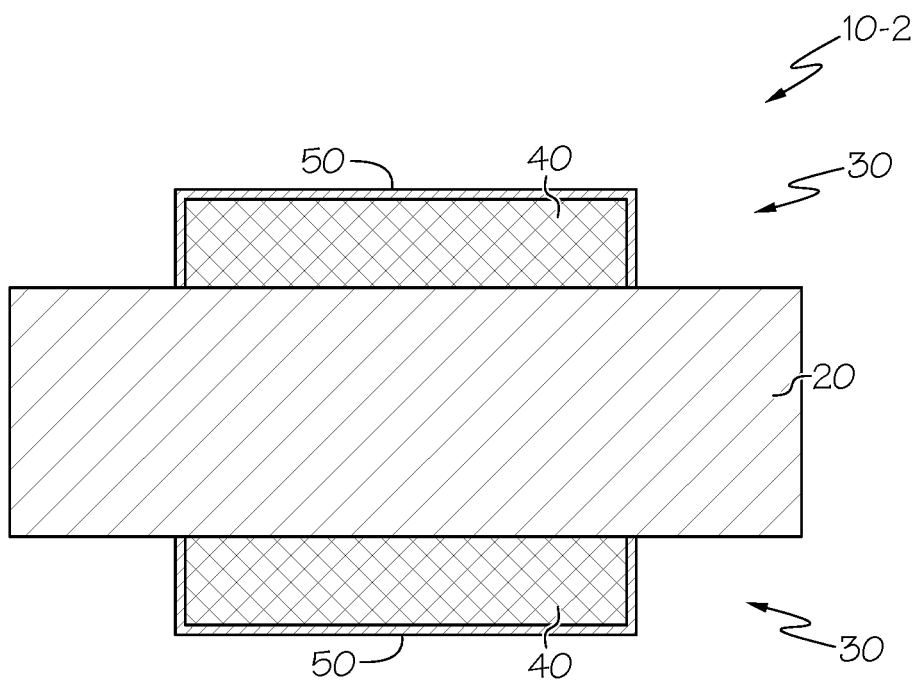
FIG. 1B schematically depicts a cross-sectional view of a conductive layer and a ceramic substrate of another example direct bonded metal substrate according to one or more embodiments shown and described herein.

With reference to FIG. 1B, a cross-section view of DBM substrate 10-2 is schematically depicted. In the illustrated embodiment, the DBM substrate 10-2 is similar to the DBM substrate 10-1 illustrated in FIG. 1A, but in this embodiment, the encapsulating layer 50 encapsulates the core 40 against the ceramic substrate 20. In various embodiments, the core 40 may be deposited onto the ceramic substrate 20, and the core 40 may then be encapsulated by the encapsulating layer 50. As a non-limiting example, an atomic vapor deposition process may be utilized to deposit the core 40 and the encapsulating layer 50 onto the ceramic substrate 20, as described below in further detail with reference to FIG. 2B.

While FIGS. 1A-1B illustrate the conductive layers 30 bonded to the ceramic substrate 20, in other embodiments, metallization layers may be disposed between the conductive layers 30 and the ceramic substrate 20 in order to bond the conductive layers 30 to the ceramic substrate 20, as described below in further detail with reference to FIGS. 1C-1D.

Figure 1C:
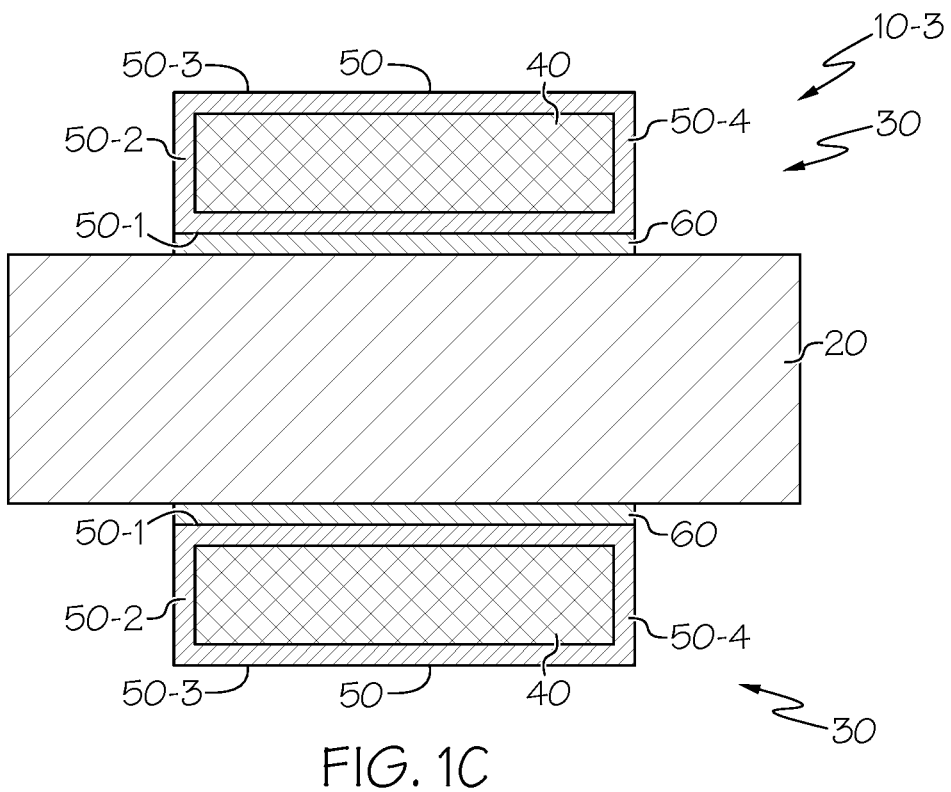
FIG. 1C schematically depicts a cross-sectional view of a conductive layer and a ceramic substrate of yet another example direct bonded metal substrate according to one or more embodiments shown and described herein.

With reference to FIG. 1C, a cross-section view of DBM substrate 10-3 is schematically depicted. In the illustrated embodiment, the DBM substrate 10-3 is similar to the DBM substrates 10-1 illustrated in FIG. 1A, but in this embodiment, the DBM substrate 10-3 includes metallization layers 60 disposed between the ceramic substrate 20 and the conductive layers 30. As a non-limiting example, the metallization layers 60 may include copper and/or nickel and may have a thickness of 10 nanometers to 0.01 millimeters, including endpoints. In some embodiments, the metallization layers 60 may further reinforce the bonding between the ceramic substrate 20 and the conductive layers 30.

In some embodiments, the metallization layers 60 may be deposited onto the ceramic substrate 20 using atomic layer deposition, chemical vapor deposition, physical vapor deposition, electroplating, electroless plating, film forming process, or other suitable processes. As a non-limiting example, the metallization layers 60 may be electrodeposited along the ceramic substrate 20 such that the metallization layers 60 are securely plated against the ceramic substrate 20. Subsequently, the first portion of the encapsulating layer 50-1 may be deposited onto the metallization layer 60. Similar to the embodiment described above with reference to FIG. 1A, the core 40 may be deposited onto the first portion of the encapsulating layer 50-1, and the core 40 may then be encapsulated by the remaining portions of the encapsulating layer 50-2, 50-3, 50-4. As a non-limiting example, an atomic vapor deposition process may be utilized to deposit the first portion of the encapsulating layer 50-1, the core 40, and the remaining portions of the encapsulating layer 50-2, 50-3, 50-4, as described below in further detail with reference to FIG. 2C.

Figure 1D:
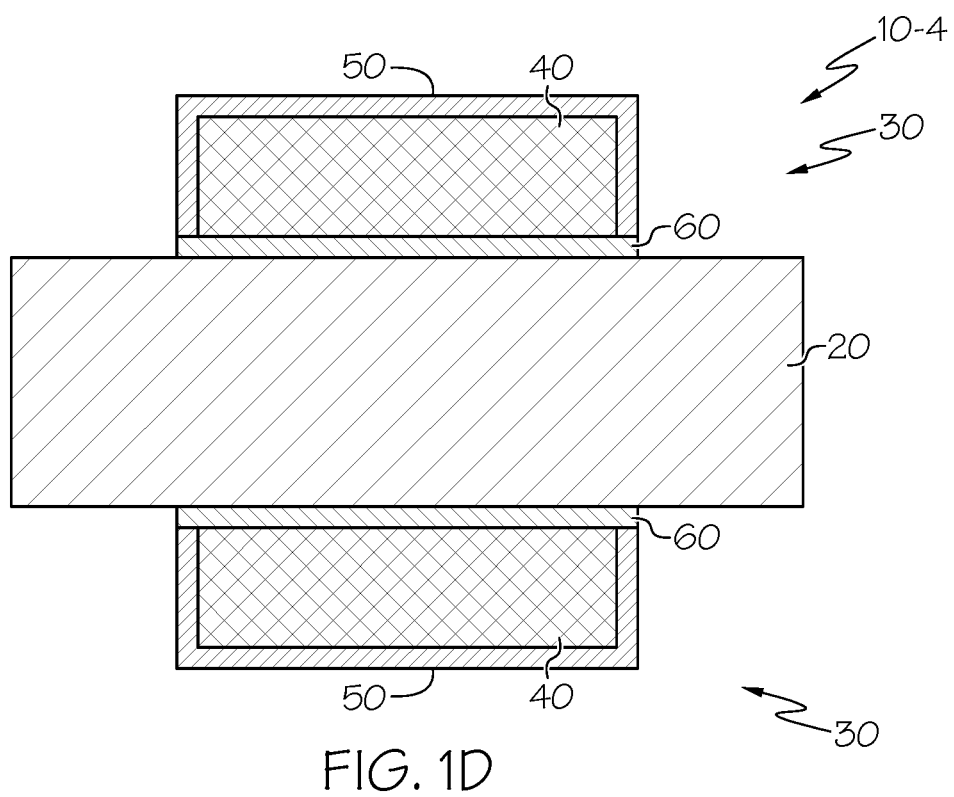
FIG. 1D schematically depicts a cross-sectional view of a conductive layer and a ceramic substrate of yet another example direct bonded metal substrate according to one or more embodiments shown and described herein.

With reference to FIG. 1D, a cross-section view of DBM substrate 10-4 is schematically depicted. In the illustrated embodiment, the DBM substrate 10-3 is similar to the DBM substrate 10-3 illustrated in FIG. 1C, but in this embodiment, the core 40 is encapsulated by the encapsulating layer 50 against the metallization layer 60.

In some embodiments, the metallization layers 60 may be deposited onto the ceramic substrate 20 using atomic layer deposition, chemical vapor deposition, physical vapor deposition, electroplating, electroless plating, film forming process, or other suitable processes. As a non-limiting example, the metallization layers 60 may be electrodeposited along the ceramic substrate 20 such that the metallization layers 60 are securely plated against the ceramic substrate 20. Accordingly, the core 40 may then be deposited onto the metallization layer 60, and the core 40 may then be encapsulated by the encapsulating layer 50. As a non-limiting example, an atomic vapor deposition process may be utilized to deposit the core 40 and the encapsulating layer 50 onto the metallization layer 60, as described below in further detail with reference to FIG. 2D.

While the above embodiments described above in FIGS. 1A-1D illustrate the core 40 and the encapsulating layer 50 bonded directly (or via the metallization layers 60) to the ceramic substrate 20, in other embodiments, the core 40 and the encapsulating layer 50 may be bonded to a metal layer of the DBM substrate, as described below in further detail with reference to FIGS. 1E-1F.

Figure 1E:
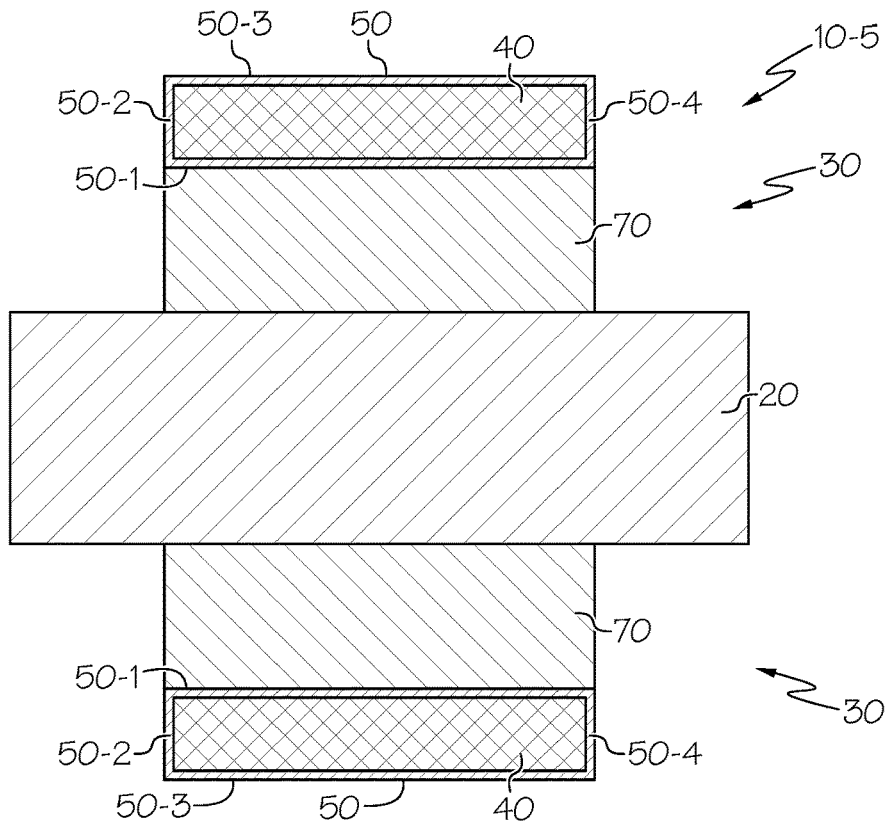
FIG. 1E schematically depicts a cross-sectional view of a conductive layer and a ceramic substrate of yet another example direct bonded metal substrate according to one or more embodiments shown and described herein.

With reference to FIG. 1E, a cross-section view of DBM substrate 10-5 is schematically depicted. In the illustrated embodiment, the DBM substrate 10-5 is similar to the DBM substrate 10-1 illustrated in FIG. 1A, but in this embodiment, the encapsulating layer 50 and the core 40 are bonded to a metal layer 70, which may include copper and/or aluminum in some example embodiments. As a non-limiting example, the metal layer 70 may have thickness in a range of 0.2 millimeters to 0.6 millimeters, including endpoints. It should be understood that any other thicknesses of the metal layer 70 be provided. In some embodiments, the encapsulating layer 50 may be bonded to the metal layer 70 using a gas-metal eutectic bonding technique, as described below in further detail.

Figure 1F:
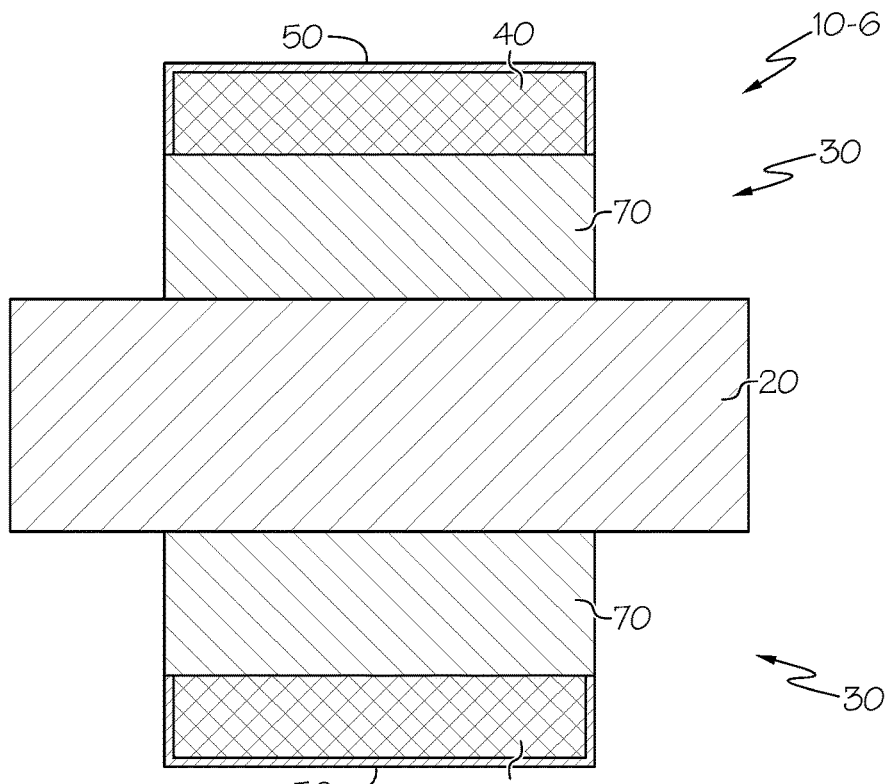
FIG. 1F schematically depicts a cross-sectional view of a conductive layer and a ceramic substrate of yet another example direct bonded metal substrate according to one or more embodiments shown and described herein.

With reference to FIG. 1F, a cross-section view of DBM substrate 10-6 is schematically depicted. In the illustrated embodiment, the DBM substrate 10-6 is similar to the DBM substrate 10-5 illustrated in FIG. 1E, but in this embodiment, the core 40 is encapsulated by the encapsulating layer 50 against the metal layer 70. In some embodiments, the encapsulating layer 50 and the core 40 may be bonded to the metal layer 70 using a gas-metal eutectic bonding technique, as described below in further detail.

Various methods may be implemented to form the DBM substrates 10-1, 10-2, 10-3, 10-4, 10-5, 10-6 (collectively referred to as DBM substrates 10) described above in FIGS. 1A-1F. As a non-limiting example and as described below in further detail with reference to FIGS. 2A-2F, the DBM substrates 10 may be formed by directly bonding the conductive layers 30 to the ceramic substrate 20 or by bonding the conductive layers 30 to the ceramic substrate 20 via the metallization layers 60.

Figure 2A:
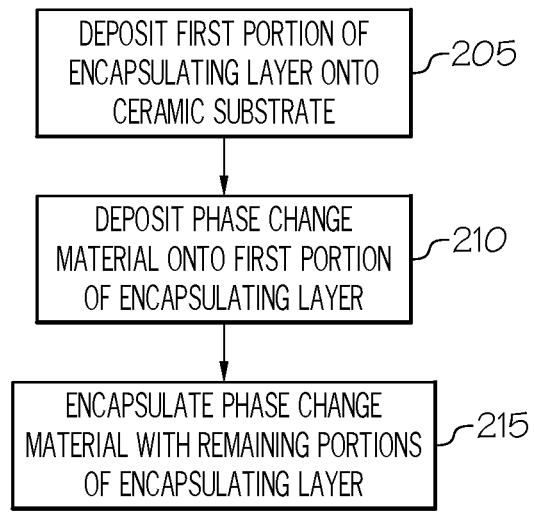
FIG. 2A depicts a flow diagram of an illustrative method for forming a direct bonded metal substrate of the electronic assembly according to one or more embodiments shown and described herein.

Referring now to FIG. 2A, a flow diagram of an illustrative method for forming the DBM substrate 10-1 of FIG. 1A is depicted. It should be understood that forming the DBM substrate 10-1 may be done using various other methods and is not limited to the process of FIG. 2A. At step 205, the first portion of the encapsulating layer 50-1 is deposited onto the ceramic substrate 20. As a non-limiting example, the first portion of the encapsulating layer 50-1 may be electrodeposited along the ceramic substrate 20 such that the first portion of the encapsulating layer 50-1 is securely plated against the ceramic substrate 20. As another non-limiting example, the first portion of the encapsulating layer 50-1 may be deposited using an atomic layer deposition process. In other embodiments, the first portion of the encapsulating layer 50-1 may be deposited using chemical vapor deposition, physical vapor deposition, electroless plating, film forming process, or other suitable processes.

At step 210, the PCM of the core 40 is deposited onto the first portion of the encapsulating layer 50-1. As a non-limiting example, the PCM may be deposited using an atomic layer deposition process. In other embodiments, the PCM may be deposited using chemical vapor deposition, physical vapor deposition, electroplating, electroless plating, film forming process, or other suitable processes. At step 215, the PCM of the core 40 is encapsulated with the remaining portions of the encapsulating layer 50-2, 50-3, 50-4. As a non-limiting example, the remaining portions of the encapsulating layer 50-2, 50-3, 50-4 may be deposited such that they encapsulate the PCM of the core 40 using an atomic layer deposition process. In other embodiments, the remaining portions of the encapsulating layer 50-2, 50-3, 50-4 may be deposited such that they encapsulate the PCM of the core 40 using chemical vapor deposition, physical vapor deposition, electroplating, electroless plating, film forming process, or other suitable processes.

Figure 2B:
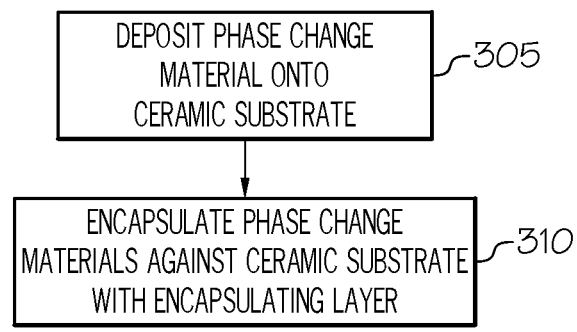
FIG. 2B depicts a flow diagram of another illustrative method for forming a direct bonded metal substrate of the electronic assembly according to one or more embodiments shown and described herein.

With reference to FIG. 2B, a flow diagram of an illustrative method for forming the DBM substrate 10-2 of FIG. 1B is depicted. It should be understood that forming the DBM substrate 10-2 may be done using various other methods and is not limited to the process of FIG. 2B. At step 305, the PCM of the core 40 is deposited onto the ceramic substrate 20. As a non-limiting example, the PCM of the core 40 may be electrodeposited along the ceramic substrate 20 such that the PCM of the core 40 is securely plated against the ceramic substrate 20. In other embodiments, the PCM of the core 40 may be deposited using chemical vapor deposition, physical vapor deposition, electroless plating, film forming process, or other suitable processes. At step 310, the PCM of the core 40 is encapsulated against the ceramic substrate 20 with the encapsulating layer 50. As a non-limiting example, the encapsulating layer 50 may be deposited such that it encapsulates the PCM of the core 40 using an atomic layer deposition process. In other embodiments, the encapsulating layer 50 may be deposited such that it encapsulates the PCM of the core 40 using chemical vapor deposition, physical vapor deposition, electroplating, electroless plating, film forming process, or other suitable processes.

Figure 2C:
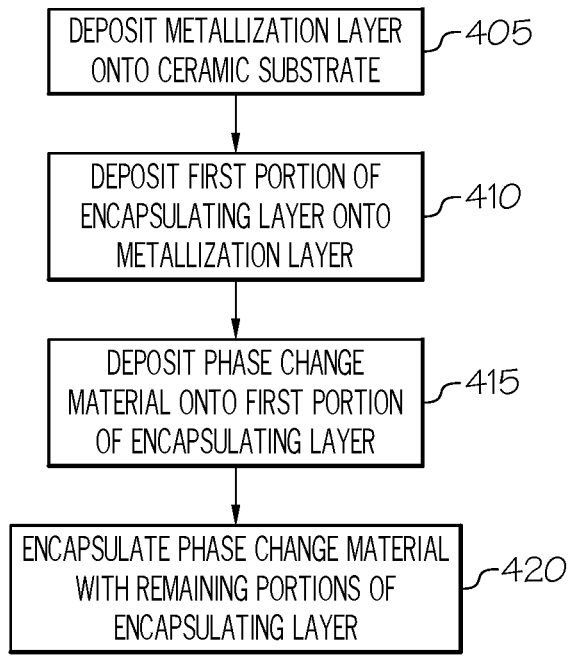
FIG. 2C depicts a flow diagram of yet another illustrative method for forming a direct bonded metal substrate of the electronic assembly according to one or more embodiments shown and described herein.

With reference to FIG. 2C, a flow diagram of an illustrative method for forming the DBM substrate 10-3 of FIG. 1C is depicted. It should be understood that forming the DBM substrate 10-3 may be done using various other methods and is not limited to the process of FIG. 2C. At step 405, the metallization layer 60 is deposited onto the ceramic substrate 20. As a non-limiting example, the metallization layer 60 may be deposited using an atomic layer deposition process. In other embodiments, the metallization layer 60 may be deposited using chemical vapor deposition, physical vapor deposition, electroplating, electroless plating, film forming process, or other suitable processes. At step 410, the first portion of the encapsulating layer 50-1 is deposited onto the ceramic substrate 20. As a non-limiting example, the first portion of the encapsulating layer 50-1 may be electrodeposited along the metallization layer 60 such that the first portion of the encapsulating layer 50-1 is securely plated against the metallization layer 60. As another non-limiting example, the first portion of the encapsulating layer 50-1 may be deposited using an atomic layer deposition process. In other embodiments, the first portion of the encapsulating layer 50-1 may be deposited using chemical vapor deposition, physical vapor deposition, electroless plating, film forming process, or other suitable processes.

At step 415, the PCM of the core 40 is deposited onto the first portion of the encapsulating layer 50-1. As a non-limiting example, the PCM may be deposited using an atomic layer deposition process. In other embodiments, the PCM may be deposited using chemical vapor deposition, physical vapor deposition, electroplating, electroless plating, film forming process, or other suitable processes. At step 420, the PCM of the core 40 is encapsulated with the remaining portions of the encapsulating layer 50-2, 50-3, 50-4. As a non-limiting example, the remaining portions of the encapsulating layer 50-2, 50-3, 50-4 may be deposited such that they encapsulate the PCM of the core 40 using an atomic layer deposition process. In other embodiments, the remaining portions of the encapsulating layer 50-2, 50-3, 50-4 may be deposited such that they encapsulate the PCM of the core 40 using chemical vapor deposition, physical vapor deposition, electroplating, electroless plating, film forming process, or other suitable processes.

Figure 2D:
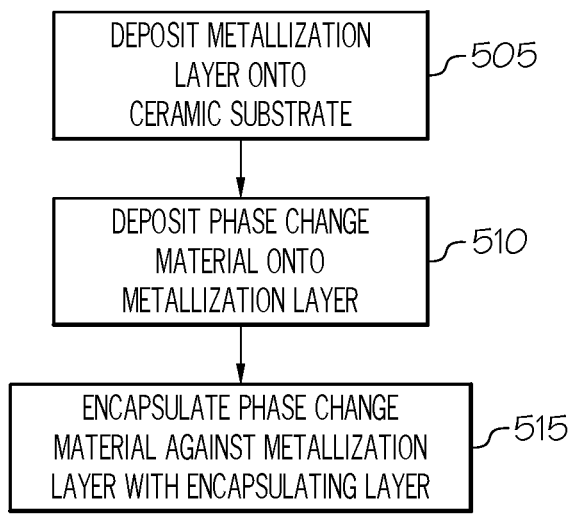
FIG. 2D depicts a flow diagram of yet another illustrative method for forming a direct bonded metal substrate of the electronic assembly according to one or more embodiments shown and described herein.

With reference to FIG. 2D, a flow diagram of an illustrative method for forming the DBM substrate 10-4 of FIG. 1D is depicted. It should be understood that forming the DBM substrate 10-4 may be done using various other methods and is not limited to the process of FIG. 2D. At step 505, the metallization layer 60 is deposited onto the ceramic substrate 20. As a non-limiting example, the metallization layer 60 may be deposited using an atomic layer deposition process. In other embodiments, the metallization layer 60 may be deposited using chemical vapor deposition, physical vapor deposition, electroplating, electroless plating, film forming process, or other suitable processes. At step 510, the PCM of the core 40 is deposited onto the metallization layer 60. As a non-limiting example, the PCM of the core 40 may be deposited using an atomic layer deposition process. As another non-limiting example, the PCM of the core 40 may be electrodeposited along the metallization layer 60 such that the PCM of the core 40 is securely plated against the metallization layer 60. In other embodiments, the PCM of the core 40 may be deposited using chemical vapor deposition, physical vapor deposition, electroplating, electroless plating, film forming process, or other suitable processes.

At step 515, the PCM of the core 40 is encapsulated against the metallization layer 60 with the encapsulating layer 50. As a non-limiting example, the encapsulating layer 50 may be deposited such that it encapsulates the PCM of the core 40 using an atomic layer deposition process. In other embodiments, the encapsulating layer 50 may be deposited such that it encapsulates the PCM of the core 40 using chemical vapor deposition, physical vapor deposition, electroplating, electroless plating, film forming process, or other suitable processes.

Figure 2E:
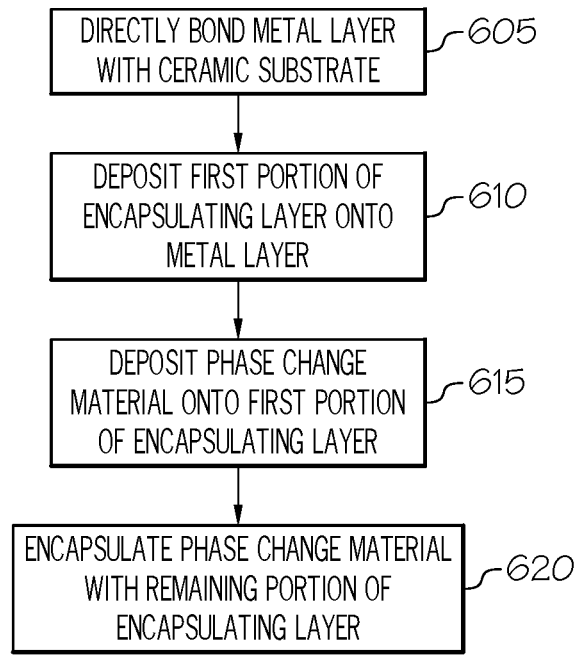
FIG. 2E depicts a flow diagram of yet another illustrative method for forming a direct bonded metal substrate of the electronic assembly according to one or more embodiments shown and described herein.

Referring now to FIG. 2E, a flow diagram of an illustrative method for forming the DBM substrate 10-5 of FIG. 1E is depicted. It should be understood that forming the DBM substrate 10-5 may be done using various other methods and is not limited to the process of FIG. 2E. At step 605, the metal layer 70 is directly bonded with the ceramic substrate 20 using, for example, using a gas-metal eutectic bonding technique or other suitable technique. At step 610, the first portion of the encapsulating layer 50-1 is deposited onto the metal layer 70. As a non-limiting example, the first portion of the encapsulating layer 50-1 may be electrodeposited along the metal layer 70 such that the first portion of the encapsulating layer 50-1 is securely plated against the metal layer 70. In other embodiments, the first portion of the encapsulating layer 50-1 may be deposited using chemical vapor deposition, physical vapor deposition, electroless plating, film forming process, or other suitable processes.

At step 615, the PCM of the core 40 is deposited onto the first portion of the encapsulating layer 50-1. As a non-limiting example, the PCM may be deposited using an atomic layer deposition process. In other embodiments, the PCM may be deposited using chemical vapor deposition, physical vapor deposition, electroplating, electroless plating, film forming process, or other suitable processes. At step 620, the PCM of the core 40 is encapsulated with the remaining portions of the encapsulating layer 50-2, 50-3, 50-4. As a non-limiting example, the remaining portions of the encapsulating layer 50-2, 50-3, 50-4 may be deposited such that they encapsulate the PCM of the core 40 using an atomic layer deposition process. In other embodiments, the remaining portions of the encapsulating layer 50-2, 50-3, 50-4 may be deposited such that they encapsulate the PCM of the core 40 using chemical vapor deposition, physical vapor deposition, electroplating, electroless plating, film forming process, or other suitable processes.

Figure 2F:
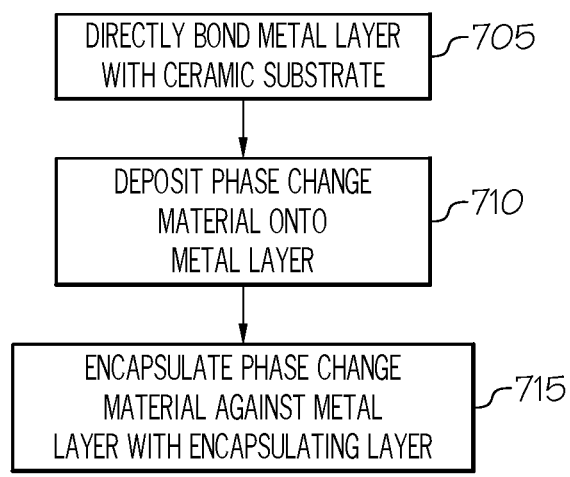
FIG. 2F depicts a flow diagram of yet another illustrative method for forming a direct bonded metal substrate of the electronic assembly according to one or more embodiments shown and described herein.

With reference to FIG. 2F, a flow diagram of an illustrative method for forming the DBM substrate 10-6 of FIG. 1F is depicted. It should be understood that forming the DBM substrate 10-6 may be done using various other methods and is not limited to the process of FIG. 2F. At step 705, the metal layer 70 is directly bonded with the ceramic substrate 20 using, for example, using a gas-metal eutectic bonding technique or other suitable technique. At step 710, the PCM of the core 40 is deposited onto the metal layer 70. As a non-limiting example, the PCM of the core 40 may be electrodeposited along the metal layer 70 such that the PCM of the core 40 is securely plated against the metal layer 70. In other embodiments, the PCM of the core 40 may be deposited using chemical vapor deposition, physical vapor deposition, electroless plating, film forming process, or other suitable processes.

At step 715, the PCM of the core 40 is encapsulated against the metal layer 70 with the encapsulating layer 50. As a non-limiting example, the encapsulating layer 50 may be deposited such that it encapsulates the PCM of the core 40 using an atomic layer deposition process. In other embodiments, the encapsulating layer 50 may be deposited such that it encapsulates the PCM of the core 40 using chemical vapor deposition, physical vapor deposition, electroplating, electroless plating, film forming process, or other suitable processes.

By forming the DBM substrates 10 and incorporating the DBM substrates 10 within an electronic assembly (shown below), the DBM substrates 10 may minimize the thermally induced mechanical stress caused by temperature cycling and the high operating temperature of the electronic assembly. Accordingly, the electronic assembly can maintain a sufficient thermal conduction, electrical conduction, and improved mechanical robustness is operating at a high operating temperature or during temperature cycling, as described below in further detail with reference to FIGS. 3A-3B and FIG. 4.

Figure 3A:
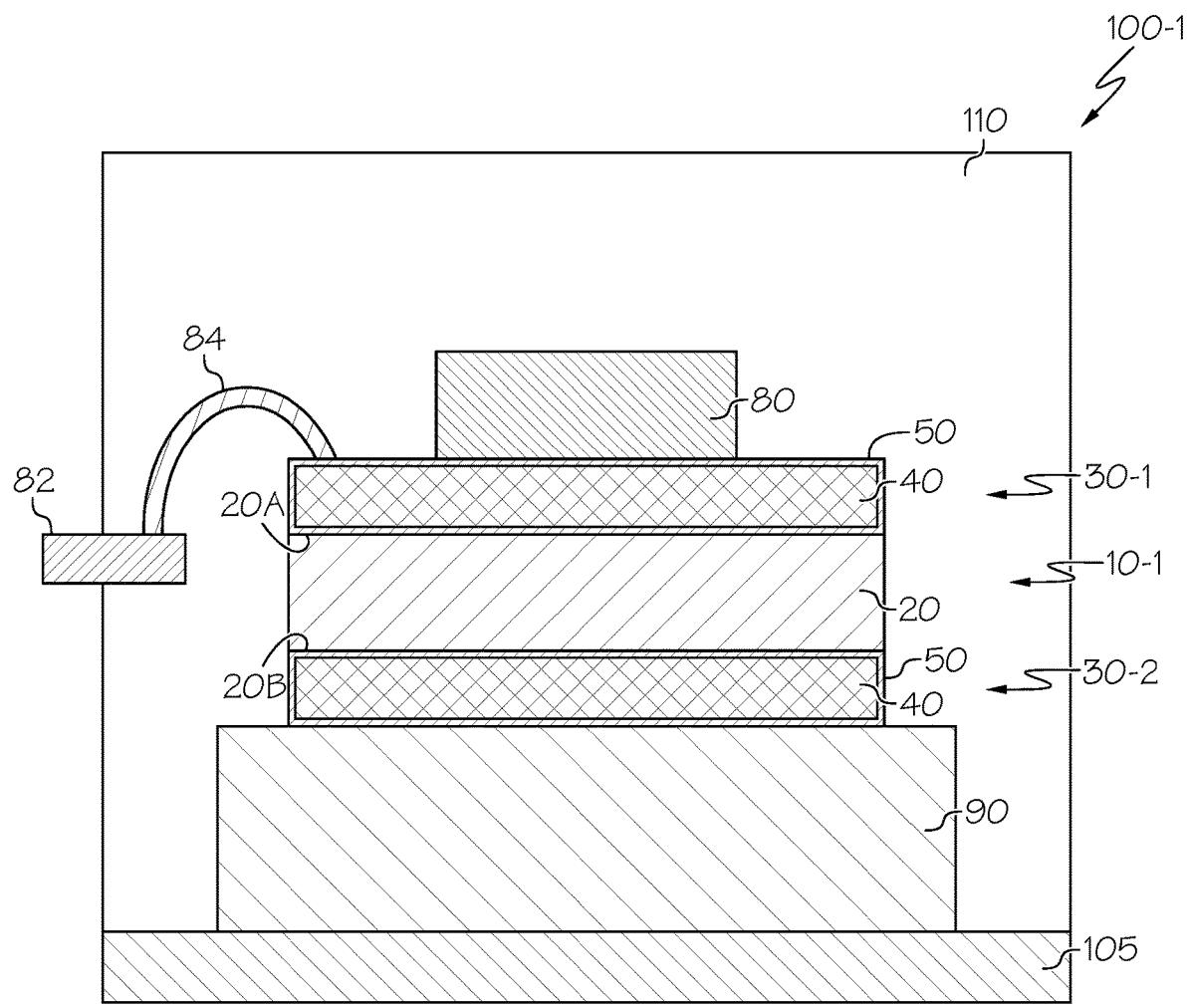
FIG. 3A schematically depicts a cross-sectional view of an example electronic assembly according to one or more embodiments shown and described herein.

Referring now to FIG. 3A, a cross-section view of an example electronic assembly 100-1 is schematically depicted. In the illustrated embodiment, the electronic assembly 100-1 includes the DBM substrate 10-1, an electronic device 80, and a base plate 90. It should be understood that in other embodiments, the electronic assembly 100-1 may include any one of DBM substrates 10.

A first conductive layer 30-1 of the DBM substrate 10-1 may be bonded to the electronic device 80 and a first surface 20A of the ceramic substrate 20, and a second conductive layer 30-2 of the DBM substrate 10-1 may be bonded with the base plate 90 and a second surface 20B of the ceramic substrate 20. As non-limiting examples, the conductive layers 30 may be bonded to the electronic device 80 and the base plate 90 using any suitable technique, such as solder reflow, wave soldering, laser soldering, ultrasonic bonding, transient liquid phase bonding, and/or thermosonic bonding.

In the illustrated embodiment, the electronic device 80 may be a thermally conductive metal, a semiconductor material (e.g., silicon carbide (SiC), silicon dioxide ($SiO_2$), aluminum nitride (AlN), gallium nitride (GaN), boron nitride (BN), diamond, and the like), an electrode, or the like. In some embodiments, the electronic device 80 may be a collector terminal or an emitter terminal of the electronic assembly 100-1. The electronic assembly 100-1 may also include a gate electrode 82 electrically coupled to the electronic device 80. The gate electrode 82 may be directly electrically coupled to the electronic device 80 or electrically coupled to the electronic device 80 via a wire 84 as a non-limiting example. In some embodiments, a signal, such as a gate voltage signal, may be applied to the gate electrode 82 to cause the electronic device 80 to conduct such that the conductive layers 30 are electrically coupled.

In the illustrated embodiment, the base plate 90 may be configured to mechanically support the DBM substrate 10-1 and the electronic device 80. Furthermore, the base plate 90 may include a thermally conductive metal configured to propagate heat generated by the electronic assembly 100-1 to a cooling device 105 bonded to the base plate 90. As a non-limiting example, the thermally conductive metal may be copper, oxygen free copper, copper alloys, aluminum, aluminum alloys, and/or other thermally conductive metals. In some embodiments, the base plate 90 may be removed from the electronic assembly 100-1 such that the DBM substrate 10-1 is bonded to the cooling device 105. In various embodiments, the cooling device 105 and the base plate 90 may be directly bonded using a variety of bonding techniques, such as solder reflow, wave soldering, laser soldering, ultrasonic bonding, transient liquid phase bonding, and/or thermosonic bonding.

In the illustrated embodiment, the cooling device 105 may be a heat sink, heat exchanger, a liquid phase cooling apparatus, either active (e.g., utilizing jet channels and pumps), passive (e.g., utilizing thermal convection, conduction, radiation, including processes such as nucleation or the like), or a combination of both, or any other cooler device capable of removing heat from the electronic assembly 100-1.

In some embodiments, one or more thermally conductive interface layers (not shown) may be positioned between the base plate 90 and the cooling device 105. As a non-limiting example, the thermally conductive interface layers may include, but are not limited to, a thermal grease or other thermally conductive bonding material.

In the illustrated embodiment, the electronic assembly 100-1 may also include a casing 110 (e.g., a resin) configured to provide a supporting structure or package to the components of the electronic assembly 100-1. As shown in the illustrated embodiment, the casing 110 encapsulates each component of the electronic assembly 100-1 except for the cooling device 105 (i.e., the cooling device 105 is located external to the casing 110). In some embodiments, the casing 110 may encapsulate each component of the electronic assembly 100-1.

Figure 3B:
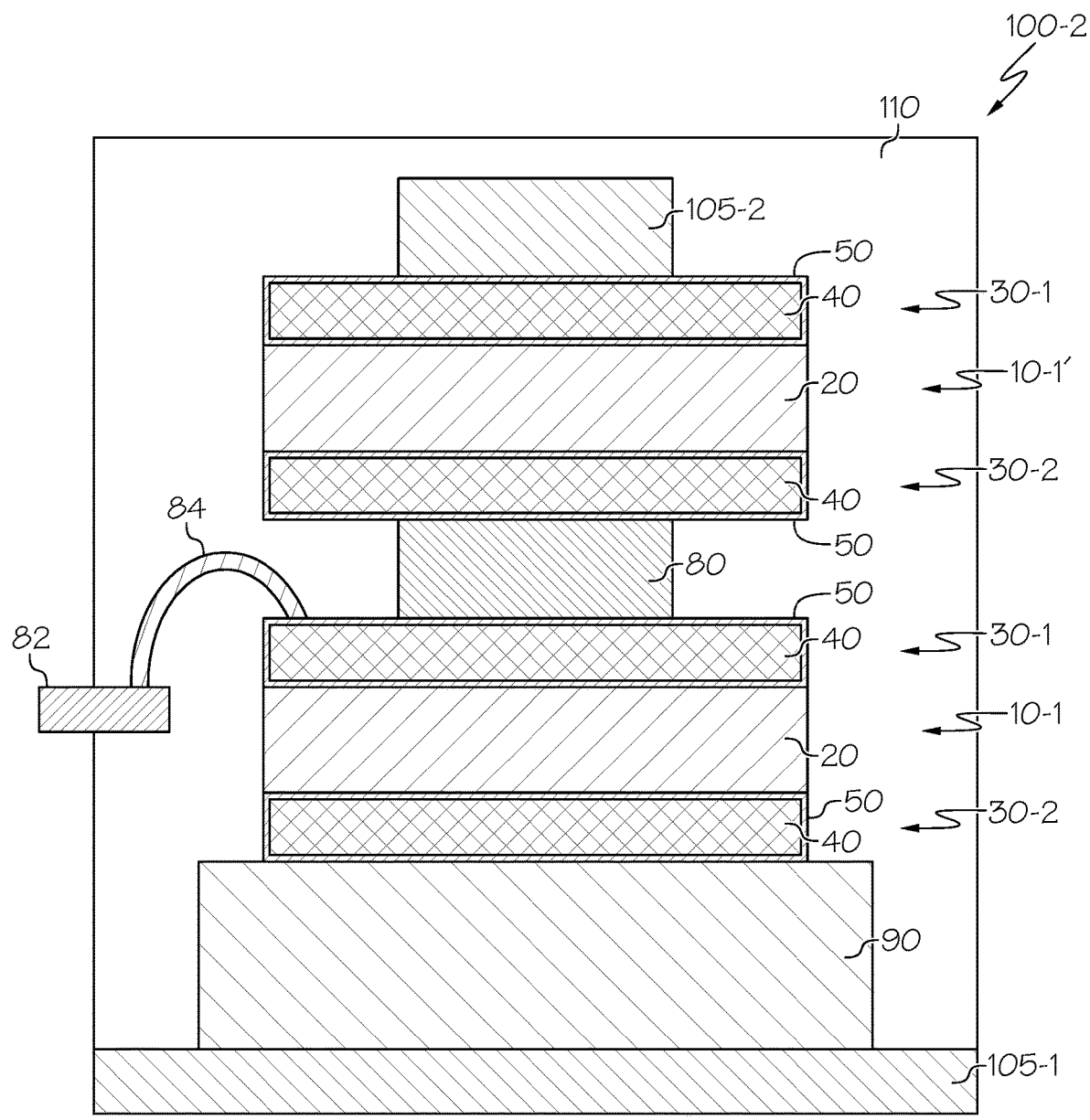
FIG. 3B schematically depicts a cross-sectional view of another example electronic assembly according to one or more embodiments shown and described herein.

With reference to FIG. 3B, a cross-section view of another example electronic assembly 100-2 is schematically depicted. The electronic assembly 100-2 is similar to the electronic assembly 100-1 described above in FIG. 3A, but in this illustrated embodiment, the electronic assembly 100-2 incorporates double-sided cooling functions, as it includes two cooling devices 105-1, 105-2. In the illustrated embodiment, cooling device 105-1 is bonded to the base plate 90, and cooling device 105-2 is bonded to the electronic device 80 via a second DBM substrate 10-1'.

Similar to the cooling device 105 of electronic assembly 100-1, the cooling devices 105-1, 105-2 of electronic assembly 100-2 may be a heat sink or a heat exchanger. In some embodiments, the cooling devices 105-1, 105-2 may be a liquid phase cooling apparatus, either active (e.g., utilizing jet channels and pumps), passive (e.g., utilizing thermal convection, conduction, radiation, including processes such as nucleation or the like), or a combination of both; or any other cooler device capable of removing heat from the electronic assembly 100-2.

While operating the electronic device 80, the electronic assemblies 100-1, 100-2 (collectively referred to as electronic assemblies 100) may be subjected to temperatures of up to 200-250° C., which may induce mechanical stress to the electronic assemblies 100. Furthermore, while heat may be removed from the electronic assemblies 100 during operation to reduce the temperature and mitigate thermally induced damage to the electronic device, the heat removal rate may be limited by the rate of heat conduction through the ceramic substrate 20 and the conductive layers 30.

In addition, the electronic assemblies 100 may be subjected to temperature cycling during electrical transients of the electronic device 80 and during the fabrication of the electronic assemblies 100. As a non-limiting example, an electrical transient occurs when the electronic device 80 is turned on and begins conducting a voltage. Turning on the electronic device 80 causes the electronic assemblies 100 to change from a nominal temperature, such as room temperature, to an operating temperature of approximately 200-250° C. As another non-limiting example, an electrical transient occurs when the electronic device 80 is turned off and ceases to conduct a voltage. Turning off the electronic device 80 causes the electronic assemblies 100 to change from the operating temperature to the nominal temperature. Moreover, since the electronic device 80, the ceramic substrate 20, and the conductive layers 30 have different coefficients of thermal expansion, the temperature cycling may induce mechanical stress in the electronic assemblies 100.

However, by including the PCM within the core 40 and encapsulating the core 40 using the encapsulating layer 50, the electronic assemblies 100 may minimize the thermally induced mechanical stress caused by temperature cycling and the high operating temperature of the electronic device 80, as described below in further detail with reference to FIG. 4. More particularly, when the electronic device operates at high temperatures, the PCM of the core 40 may change phases, and during the phase change, the PCM absorbs heat generated by the electronic device 80 at a constant temperature. Accordingly, the heat capacity of the electronic assemblies 100 is increased, and the electronic assemblies 100 can effectively remove a greater amount of heat during operating periods of high heat output. Simultaneously, the magnitude of temperature cycling of the electronic assemblies 100 decrease, thereby minimizing the thermally induced mechanical stress to the electronic assemblies 100 when the electronic device 80 is operating at the threshold temperature and during temperature cycling. Accordingly, the electronic assemblies 100 can maintain a sufficient thermal conduction, electrical conduction, and improved mechanical robustness when the electronic device 80 is operating at a high operating temperature or during temperature cycling.

Figure 4:
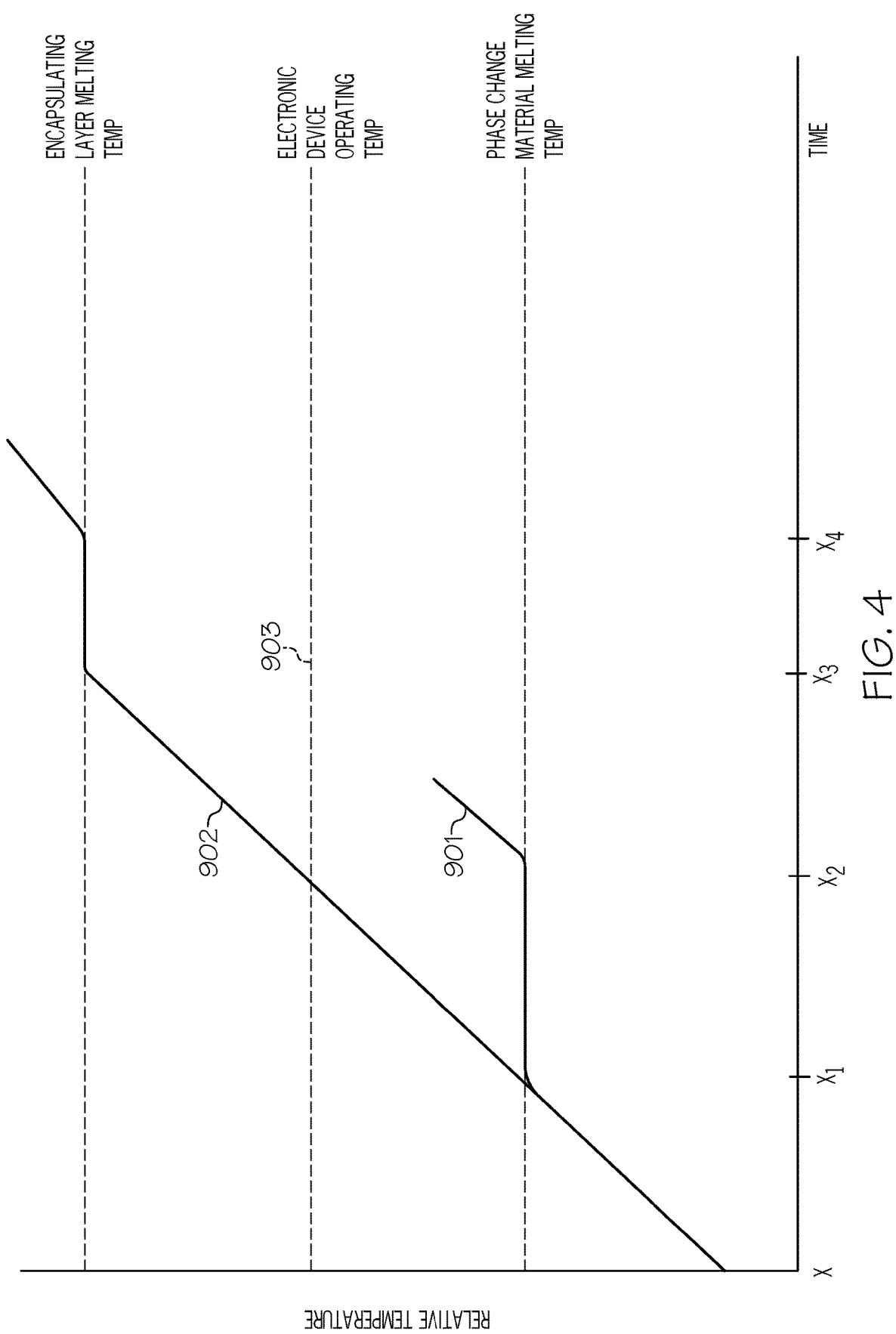
FIG. 4 graphically depicts the temperature of a phase change material and an encapsulating layer of FIGS. 3A-3B (y-axis) as a function of time (x-axis) under constant applied heat flux according to one or more embodiments shown and described herein.

Referring now to FIG. 4, a graph illustrating the temperature of the PCM of the core 40 and the encapsulating layer 50 in response to constant heat input as a function of time is depicted. In FIG. 4, X is time zero at which the PCM of the core 40 and the encapsulating layer 50 are at a temperature less than the melting temperature of the PCM of the core 40 at time $X_1$.

As constant heat is applied between time X and $X_1$, the temperature of the PCM of the core 40 increases, as indicated by curve 901. When the PCM reaches the melting temperature $T_1$ at time $X_1$, additional heat input causes the PCM to change phase, such as transitioning from a solid phase to a liquid phase. Between times $X_1$ and $X_2$, the heat input energy is absorbed by the PCM as it changes phase, and the temperature of the PCM remains constant. Thus, during the phase change, the PCM absorbs additional heat without a corresponding increase in the temperature. When the PCM has changed phase at time $X_2$, continued heat input may cause the temperature of the PCM to increase again.

As the constant heat is applied between time X and $X_2$, the temperature of the encapsulating layer 50 increases, as indicated by curve 902. When the encapsulating layer 50 reaches the melting temperature $T_2$ at time $X_3$, additional heat input causes the encapsulating layer 50 to change phase, such as transitioning from a solid phase to a liquid phase. Between times $X_3$ and $X_4$, the heat input energy is absorbed by the encapsulating layer 50 as it changes phase, and the temperature of the encapsulating layer 50 remains constant. Thus, during the phase change, the encapsulating layer 50 absorbs additional heat without a corresponding increase in the temperature. When the encapsulating layer 50 has changed phase at time $X_4$, continued heat input may cause the temperature of the encapsulating layer 50 to increase again.

However, since the operating temperature $T_{operating}$ of the electronic device 80, as indicated by dashed line 903, is less than the melting temperature $T_2$, the encapsulating layer 50 does not melt during operation of the electronic device 80. Moreover, the operating temperature $T_{operating}$ of the electronic device 80 is greater than the melting temperature $T_1$ of the PCM of the core 40. Accordingly, as the PCM of the core 40 melts and as the electronic device 80 operates at the operating temperature $T_{operating}$, the encapsulating layer 50 remains in the solid phase and does not melt. Furthermore, since the encapsulating layer 50 may have a Young's modulus that causes the encapsulating layer 50 to flex when the electronic device 80 operates at the operating temperature $T_{operating}$, the encapsulating layer 50 is configured to better accommodate the thermal coefficient of expansion mismatches of the electronic assemblies 100. In other words, the flexing of the encapsulating layer 50 when the PCM melts prevents expansions of the conductive layers 30 and the ceramic substrate 20 from inducing mechanical stress in the electronic assemblies 100. Therefore, the flexing of the encapsulating layer 50 when the PCM of the core 40 melts minimizes the mechanical stress applied to the conductive layers 30 and the ceramic substrate 20 when the electronic device 80 is operating at the operating temperature $T_{operating}$.

It should be understood by the above embodiments that forming and depositing the conductive layers 30 onto the ceramic substrate 20 enables the electronic assemblies 100 to mitigate the thermally induced mechanical stress caused by temperature cycling and the high operating temperature of the electronic device 80. More particularly, when the electronic device 80 operates at high temperatures, the PCM of the core 40 may change phases, and during the phase change, the PCM of the core 40 absorbs heat generated by the electronic device 80 at a constant temperature. Accordingly, the heat capacity of the electronic assemblies 100 is increased, and the electronic assemblies 100 can effectively remove a greater amount of heat during operating periods of high heat output. Simultaneously, the magnitude of temperature cycling of the electronic assemblies 100 decrease, thereby minimizing the thermally induced mechanical stress to the electronic assemblies 100 when the electronic device 80 is operating at the threshold temperature and during temperature cycling.

Furthermore, the flexible encapsulating layer 50 enables the conductive layers 30 to flex when the electronic device 80 operates at high operating temperatures. Furthermore, the higher melting temperature of the encapsulating layer 50 with respect to the PCM of the core 40 enables the encapsulating layer 50 to, without melting, flex when the electronic device 80 operates at high temperatures. Accordingly, the thermally induced mechanical stress to the electronic assemblies 100 when the electronic device 80 is operating at high temperatures or during temperature cycling is substantially reduced.

It will be apparent to those skilled in the art that various modifications and variations can be made without departing from the spirit or scope of the disclosure. Since modifications, combinations, sub-combinations and variations of the disclosed embodiments incorporating the spirit and substance of the disclosure may occur to persons skilled in the art, the disclosure should be construed to include everything within the scope of the appended claims and their equivalents.

The invention claimed is:
1. A direct-bonded metal substrate comprising:
  a ceramic substrate;
  a first conductive layer bonded to a first surface of the ceramic substrate and comprising a first core and a first encapsulating layer, wherein:
    the first core comprises a phase change material (PCM) having a first melting temperature and comprising one of tin, indium, paraffin wax, and bismuth;
    the first encapsulating layer comprises an encapsulating material having a second melting temperature;
    the second melting temperature is greater than the first melting temperature; and the first core is entirely encapsulated by the first encapsulating layer or the first encapsulating layer and the first surface of the ceramic substrate; and a second conductive layer bonded to a second surface of the ceramic substrate and comprising a second core and a second encapsulating layer encapsulating the second core, which comprises a PCM.

2. The direct-bonded metal substrate of claim 1, wherein:
the second core comprises the PCM having the first melting temperature; and
the second encapsulating layer comprises the encapsulating material having the second melting temperature.

3. The direct-bonded metal substrate of claim 1, wherein the encapsulating material comprises platinum.

4. The direct-bonded metal substrate of claim 1, wherein the first melting temperature is in a range of 50° C. and 250° C., including endpoints.

5. The direct-bonded metal substrate of claim 1, wherein the second melting temperature is greater than 250° C.

6. The direct-bonded metal substrate of claim 1, wherein the ceramic substrate comprises one of alumina, aluminum nitride, beryllium oxide, silicon nitride, and silicon carbide.

7. The direct-bonded metal substrate of claim 1, wherein the encapsulating material is configured to flex in response to a temperature of the encapsulating material being greater than or equal to the first melting temperature and less than the second melting temperature.

8. An electronic assembly comprising:
an electronic device having an operating temperature; and
a direct-bonded metal substrate bonded to the electronic device, wherein the direct-bonded metal substrate comprises:
a ceramic substrate;
a first conductive layer disposed on a first surface of the ceramic substrate and comprising a first core and a first encapsulating layer that encapsulates the first core, wherein:
the first core comprises a phase change material (PCM) having a first melting temperature and comprising one of tin, indium, paraffin wax, and bismuth;
the first encapsulating layer comprises an encapsulating material having a second melting temperature is greater than the first melting temperature;
the operating temperature is greater than the first melting temperature and less than the second melting temperature;
the first core is entirely encapsulated by the first encapsulating layer or the first encapsulating layer and the first surface of the ceramic substrate; and
the electronic device is bonded to the first encapsulating layer; and
a second conductive layer bonded to a second surface of the ceramic substrate and comprising a second core and a second encapsulating layer that encapsulates the second core, which comprises a PCM.

9. The electronic assembly of claim 8,
wherein:
the second core comprises the PCM having the first melting temperature; and
the second encapsulating layer comprises the encapsulating material having the second melting temperature.

10. The electronic assembly of claim 8, the encapsulating material comprises platinum.

11. The electronic assembly of claim 8, wherein the first melting temperature is in a range of 50° C. and 250° C., including endpoints.

12. The electronic assembly of claim 8, wherein the second melting temperature is greater than 250° C.

13. The electronic assembly of claim 8, wherein the ceramic substrate comprises one of alumina, aluminum nitride, beryllium oxide, silicon nitride, and silicon carbide.

14. The electronic assembly of claim 8, wherein the encapsulating material is configured to flex in response to a temperature of the encapsulating material being greater than or equal to the first melting temperature and less than the second melting temperature.

15. A method of forming a direct-bonded metal substrate comprising:
depositing a first core onto a first surface of a ceramic substrate, wherein the first core comprises a phase change material (PCM) having a first melting temperature and comprising one of tin, indium, paraffin wax, and bismuth;
bonding the first core to the first surface of the ceramic substrate; and
encapsulating the first core against the first surface of the substrate with a first encapsulating layer, wherein:
the first core is entirely encapsulated between the first encapsulating material and the first surface of the ceramic substrate;
the first encapsulating layer comprises an encapsulating material having a second melting temperature greater than the first melting temperature;
depositing a second core comprising the PCM onto a second surface of the ceramic substrate;
bonding the second core to the second surface of the ceramic substrate; and
encapsulating the second core against the second surface of the substrate with a second encapsulating layer.

16. The method of claim 15, wherein:
the second encapsulating layer comprises the encapsulating material.

17. The method of claim 15, wherein bonding the first core to the first surface of the ceramic substrate further comprises directly bonding the first core to the first surface of the ceramic substrate.

18. The method of claim 15, further comprising bonding the first core and an intermediate layer to the first surface of the ceramic substrate.

* * * * *